United States Patent
Gempe et al.

[11] Patent Number: 6,031,251
[45] Date of Patent: Feb. 29, 2000

[54] LINEAR INTEGRATED OPTOCOUPLER AND METHOD FOR FORMING THE SAME

[75] Inventors: Horst A. Gempe, Phoenix; Gary W. Hoshizaki, Mesa, both of Ariz.

[73] Assignee: Motorola, Inc., Schaumburg, Ill.

[21] Appl. No.: 08/345,917

[22] Filed: Nov. 28, 1994

Related U.S. Application Data

[63] Continuation of application No. 08/072,016, Jun. 7, 1993.

[51] Int. Cl.[7] .............................. H01L 31/16; H01L 27/15
[52] U.S. Cl. ................................. 257/84; 257/80; 257/85; 257/98
[58] Field of Search .................................. 257/84, 85, 80, 257/98

[56] References Cited

U.S. PATENT DOCUMENTS

| | | | |
|---|---|---|---|
| 3,229,104 | 1/1966 | Rutz | 257/84 |
| 3,659,159 | 4/1972 | Nagata | 257/84 |
| 3,881,113 | 4/1975 | Rideout | 257/84 |
| 4,614,958 | 9/1986 | Mikami et al. | 257/85 |
| 4,675,518 | 6/1987 | Oimura et al. | 257/85 |

FOREIGN PATENT DOCUMENTS

| | | | |
|---|---|---|---|
| 58-48481 | 3/1983 | Japan | 257/85 |
| 59-222973 | 12/1984 | Japan | 257/84 |
| 62-287673 | 12/1987 | Japan | 257/84 |

*Primary Examiner*—Jerome Jackson, Jr.
*Attorney, Agent, or Firm*—Bradley J. Botsch Sr.; Gary W. Hoshizaki; Lanny L. Parker

[57] ABSTRACT

A linear optocoupler (71) having a light emitting diode (28) and a detector diode (29) formed on a common semiconductor substrate (33). Light emitted by the light emitting diode (28) is transmissive to semiconductor substrate (33). A layer of light reflective material (34) is formed on a side opposite from which the light emitting diode (28) and the detector diode (29) on the semiconductor substrate (33). A portion of light emitted by the light emitting diode (28) transmits through the semiconductor substrate (33) to be reflected by the layer of light reflective material (34). The reflected light transmits through the semiconductor substrate (33) to be received by the detector diode (29). A photo detector diode (61) and the semiconductor substrate (33) including the light emitting diode (28) and the detector diode (29) are mounted on a lead frame (51) co-planar to one another. A light flux coupling media (76) couples light from the light emitting diode (28) to the photo detector diode (29).

3 Claims, 4 Drawing Sheets

LINEAR INTEGRATED OPTOCOUPLER AND METHOD FOR FORMING THE SAME

This application is a continuation of prior application Ser. No. 08/072,016, filed Jun. 7, 1993 abandoned.

BACKGROUND OF THE INVENTION

This invention relates, in general to optocouplers, and more particularly to an integrated circuit combining a light emitting diode and a detector diode on a common substrate for a linear optocoupler.

Standard transistor optocoupler circuits are generally built and assembled from discrete components. For example, a common linear optocoupler comprises a light emitting diode (LED), a detector diode (or servo detector diode), and a photo detector diode. Typically, the light emitting diode and the servo detector diode are gallium arsenide diodes. The photo detector diode is normally a silicon photo diode. Each component is a discrete device that is mounted and aligned within a complex package such that the detector diode and photo detector diode each receives light emitted from the light emitting diode. The components are placed in close proximity to one another to maximize light transmission and reception (within the constraints of the package) Silicone gel is sometimes used as a light flux coupling media between the light emitting diode and the servo and photo detector diodes.

There are several problems that can be traced to the use of discrete components. First, a fairly complex package must be designed to hold each component in a very exacting relationship to one another. For example, a non-planar lead frame package having two opposed surfaces is well known in the optocoupler art. A light emitting diode and a servo detector diode are placed on one surface. A photo detector diode is placed on the other surface across from the LED. The photo detector diode is aligned to maximize light reception from the LED. This type of packaging is difficult to manufacture and expensive.

Second, alignment is critical. For example, the LED flux coupling factor between the LED and the detector diode depends on the placement accuracy of the detector diode with respect to the LED. This problem can be reduced by the use of light flux coupling media as described above.

Third, using discrete components decreases linearity of a linear optocoupler due to manufacturing tolerances. Also, temperature and aging affects are magnified due to the different manufacture of each component.

Finally, using individual components requires more part testing, more handling, and increased potential for yield losses or field failures. It would be of great benefit if a linear optocoupler could be formed which increases linearity, simplifies manufacture, and reduces cost.

SUMMARY OF THE INVENTION

Briefly stated, there is provided a linear optocoupler having a light emitting diode and a detector diode integrated on a common semiconductor substrate. The semiconductor substrate is transmissive to light emitted by the light emitting diode and forms a cathode for both the light emitting diode and the detector diode. An anode of the light emitting diode and an anode of the detector diode is formed on the substrate. The detector diode receives light transmitted through the semiconductor substrate.

A method is provided for coupling light emitted from a light emitting diode to a detector diode formed on a common semiconductor substrate. A light emitting diode and detector diode is formed on the semiconductor substrate. Light emitted by the light emitting diode is transmissive to the semiconductor substrate. A portion of the light emitted by the light emitting diode is transmitted through the semiconductor substrate to be received by the detector diode.

DETAILED DESCRIPTION OF THE DRAWINGS

Figure 1:
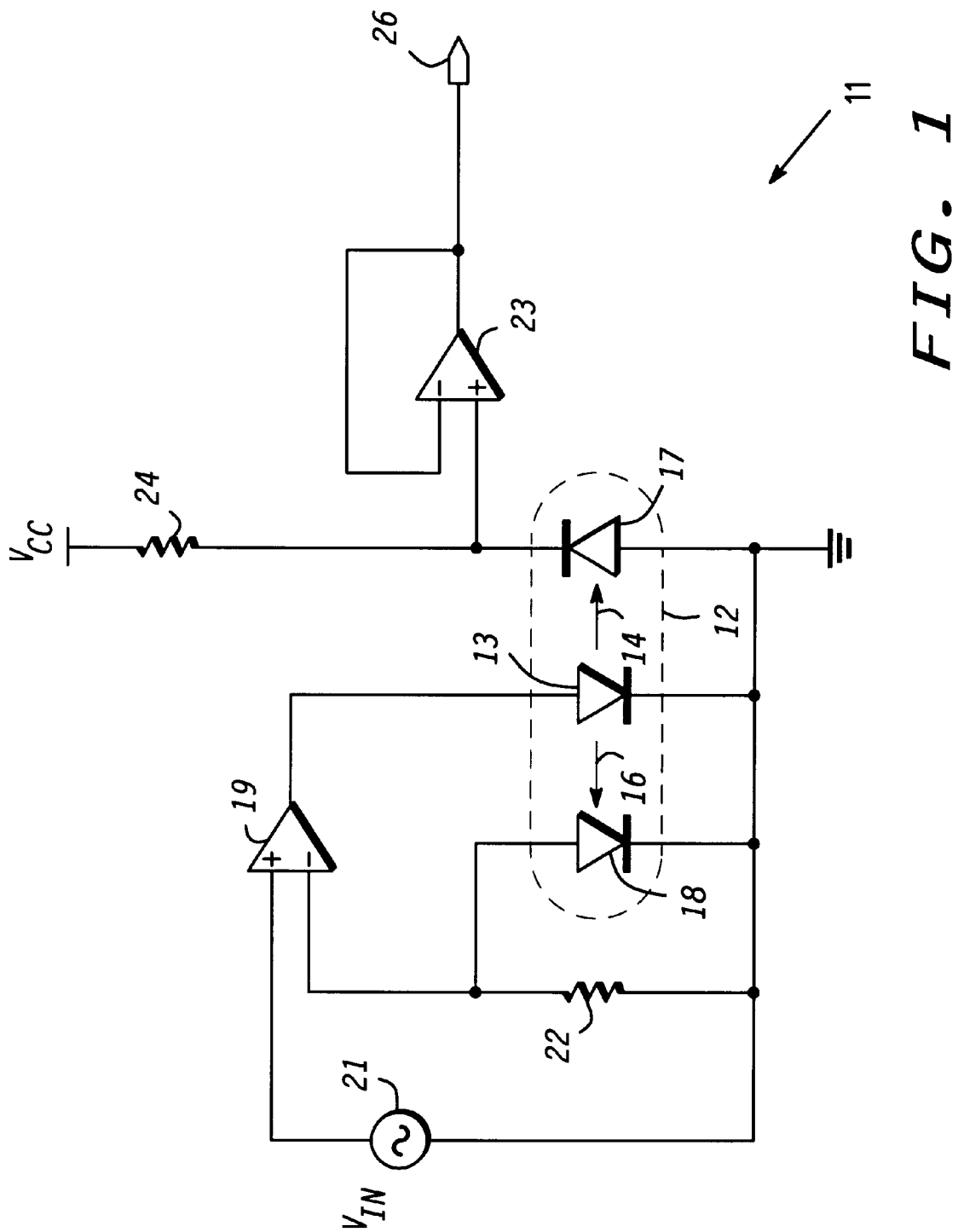
FIG. 1 is an illustration of a common usage of a linear optocoupler.

FIG. 1 is an illustration of a common usage of a linear optocoupler 12.

It is well known in the art that linear optocouplers provide non-electrical coupling between circuits. Some common applications for optocouplers are power supply feedback (voltage/current), medical sensor isolation, audio signal interfacing, and isolation of process control transducers to name only a few. A light emitting diode (LED) and photo detector diode are used to create the isolation between circuits. The light emitting diode of a first circuit emits light that is received by the photo detector diode of a second circuit and converted to a voltage or current signal. The problem with using only a light emitting diode and a photo detector diode is that the LED and photodetector diode produce non-linear results. A linear input signal biasing the LED will produce non-linear results at the photo detector diode.

For linear applications a detector diode is added to an optocoupler. The detector diode which is also known as a servo feedback diode, senses light transmitted by the light emitting diode and generates a current proportional to the light received from the LED. It is well known by those skilled in the art that the detector diode can be configured in either a reverse biased mode or in a photovoltaic mode to sense light emitted by the LED. A signal current/voltage generated by the detector diode is used as a control signal to servo the current driving the LED to linearize the input to output relationship. Other factors that also affect linearity are temperature, aging, and variations in light reception of the detector diode. It is essential that the detector diode receives a constant and repeatable light flux coupling to the light emitting diode. Using a discrete light emitting diode and a discrete detector diode pose multiple problems in placement, aging characteristics, and increased manufacturing costs. All of these problems can be eliminated by integrating the light emitting diode and the detector diode on a common substrate.

A schematic of a well known optically isolated circuit 11, using a linear optocoupler 12, and more particularly, a detector diode 18 to linearize circuit 11 response is illustrated in FIG. 1. Linear optocoupler 12 includes a light emitting diode 13, detector diode 18, and a photo detector diode 17. Light emitting diode 13 is forward biased to emit light. Light emitted by light emitted diode 13 is illustrated by arrows 14 and 16. Detector diode 18 is configured in a photovoltaic mode and photo detector diode 17 is reverse biased. The current generated by detector diode 18 and photo detector diode 17 varies with light intensity emitted by light emitting diode 13.

An input circuit comprises an amplifier 19, a resistor 22, light emitting diode (LED) 13, and detector diode 18. A voltage source 21 supplies an input signal to amplifier 19.

An output circuit, optically isolated from the input circuit comprises photo detector diode 17, resistor 24 and buffer amplifier 23.

Linearity is achieved through the use of feedback. Detector diode 18 is in the feedback path of amplifier 19. Detector diode 18 is coupled in the photovoltaic mode in circuit 11. Coupling detector diode 18 in the photovoltaic mode generates no current when LED 13 is off. Using detector diode 18 in the photovoltaic mode requires extremely good light flux coupling with LED 13 which is difficult to achieve with discrete components. A portion of the emitted light from light emitting diode 13 is received by detector diode 18 and converted to a current/voltage which is applied to a negative input of amplifier 19. Calculating the overall gain (positive input of amplifier 19 to an output 26 of circuit 11 yields a transfer function that is independent of light emitting diode 13 bias current. The use of feedback to improve linearity is well known in the art. The ability of detector diode 18 to accurately receive light emitted by light emitting diode 13 under all operating conditions is critical to circuit 11 linearity.

Figure 2:
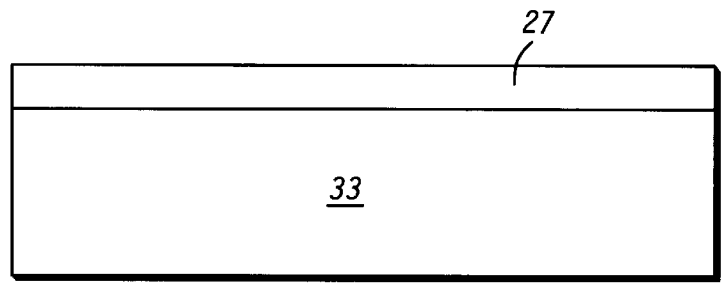
FIG. 2 is a cross-sectional view of an epitaxial layer formed on a semiconductor substrate in accordance with the present invention.

FIG. 2 is a cross-sectional view of epitaxial layer 27 formed on a semiconductor substrate 33. In the preferred embodiment, semiconductor substrate 33 is gallium arsenide. Gallium Arsenide has two properties which make it suitable for a linear optocoupler application. First, light emitting diodes that emit light in the infra-red range are easily formed on gallium arsenide. Second, gallium arsenide is transmissive to infra-red signals. Similarly, other semiconductor materials such as silicon can equally be used as the semiconductor substrate as long as the emitted light from the light emitting diode formed on the semiconductor substrate is transmissive to the semiconductor substrate.

Epitaxial layer 27 is formed on one planar side of semiconductor substrate 33. Epitaxial layer 27 and semiconductor substrate 33 form a diode. Epitaxial layer 27 corresponds to an anode of the diode. Semiconductor substrate 33 corresponds to a cathode of the diode.

Figure 3:
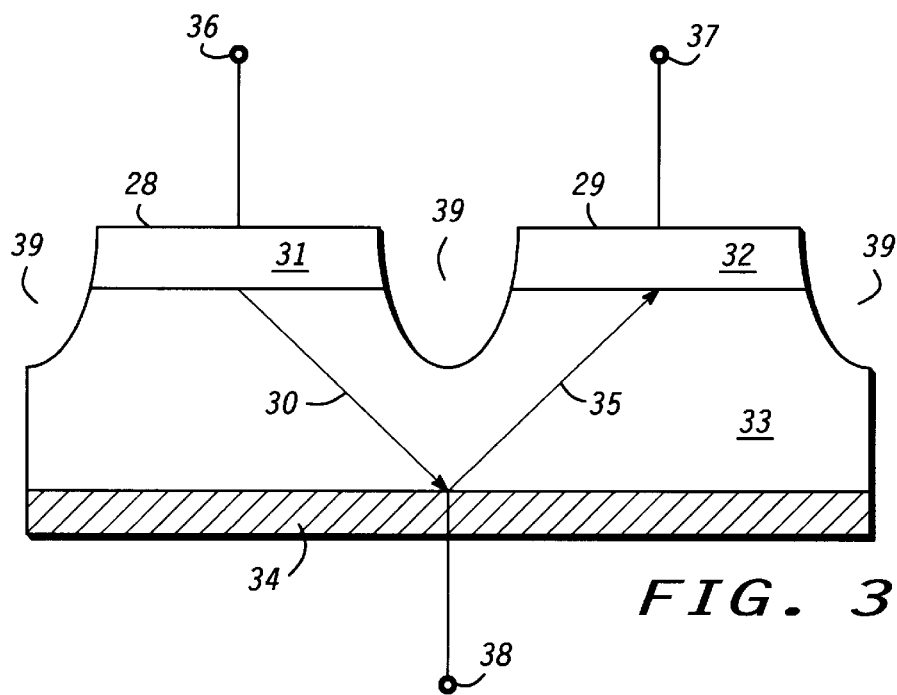
FIG. 3 is a cross-sectional view of an embodiment of a light emitting diode and a detector diode integrated on a semiconductor substrate in accordance with the present invention.

FIG. 3 is a cross-sectional view of a light emitting diode 28 and a detector diode 29 integrated on a semiconductor substrate 33 in accordance with the present invention. FIG. 3 corresponds to FIG. 2, illustrating further process steps needed to form light emitting diode 28 and detector diode 29.

Two isolated epitaxial regions are formed on semiconductor substrate 33 by etching channels 39 through epitaxial layer 27 (of FIG. 2) to semiconductor substrate 33. An epitaxial region 31 forms an anode of light emitting diode 28. An epitaxial region 32 forms an anode of detector diode 29. Semiconductor substrate 33 forms a cathode for both light emitting diode 28 and detector diode 29. A terminal 36 couples to epitaxial region 31 and a terminal 37 couples to epitaxial region 32 providing electrical connection points.

A layer of light reflective material 34 is formed on a second planar side of semiconductor substrate 33 opposite from which the two isolated epitaxial regions are formed. In the preferred embodiment, light reflective material 34 is electrically conductive and is chosen from a group of materials comprising gold, silver, and aluminum to name only a few. Light reflective material 34 electrically couples to semiconductor substrate 33. A terminal 38 couples to semiconductor substrate 33 for providing an electrical connection point.

Light emitting diode 28 is normally operated in a forward biased mode and detector diode 29 is normally operated in either a reverse biased or a photovoltaic mode. Light is emitted, from light emitting diode 28 when it is forward biased. A portion of the emitted light transmits through semiconductor substrate 33, as illustrated by arrow 30, to be reflected off light reflective material 34. The light (illustrated by arrow 30) transmits back through semiconductor substrate 33 as shown by arrow 35 to be received by detector diode 29. Detector diode 29 generates a current that is a function of the reflected light received when coupled in the reverse biased or photovoltaic modes.

It is well known in the processing arts that semiconductor substrate 33 has a conductivity type opposite from that of epitaxial region 31 and region 32 to form light emitting diode 28 and detector diode 29. The characteristics of semiconductor substrate 33 and epitaxial regions 31 and 32 determine such obvious factors as the wave length of light emitted by light emitting diode 28 or breakdown voltages, these factors are tailored for the specific linear optocoupler application.

Figure 4:
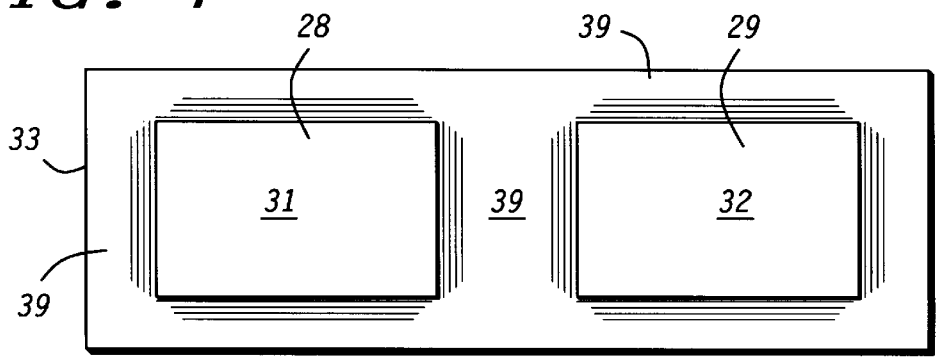
FIG. 4 is a top view of the light emitting diode and the detector diode illustrated in FIG. 3 showing isolated epitaxial regions.

FIG. 4 is a top view of light emitting diode 28 and detector diode 29 corresponding to FIG. 3 and illustrating isolated epitaxial region 31 and region 32. In the preferred embodiment, etched channels 39 surround epitaxial region 31 and region, infact, any arrangement will suffice which electrically isolates epitaxial region 31 and region 32. Electrical contact to semiconductor substrate 33 is achieved through light reflective material 34 (not shown).

Figure 5:
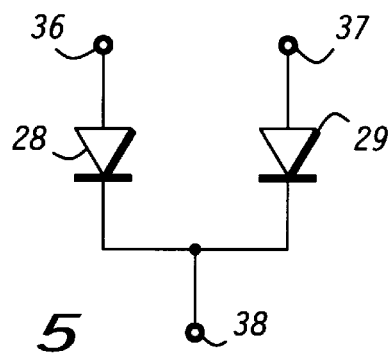
FIG. 5 is a schematic diagram of the light emitting diode and the detector diode of FIG. 3 in accordance with the present invention.

FIG. 5 is a schematic representation of light emitting diode 28 and detector diode 29 illustrated in FIG. 3. Terminal 38 couples to the common cathodes of light emitting diode 28 and detector diode 29. Terminal 36 couples to the anode of light emitting diode 28 and terminal 37 couples to the anode of detector diode 29.

Figure 6:
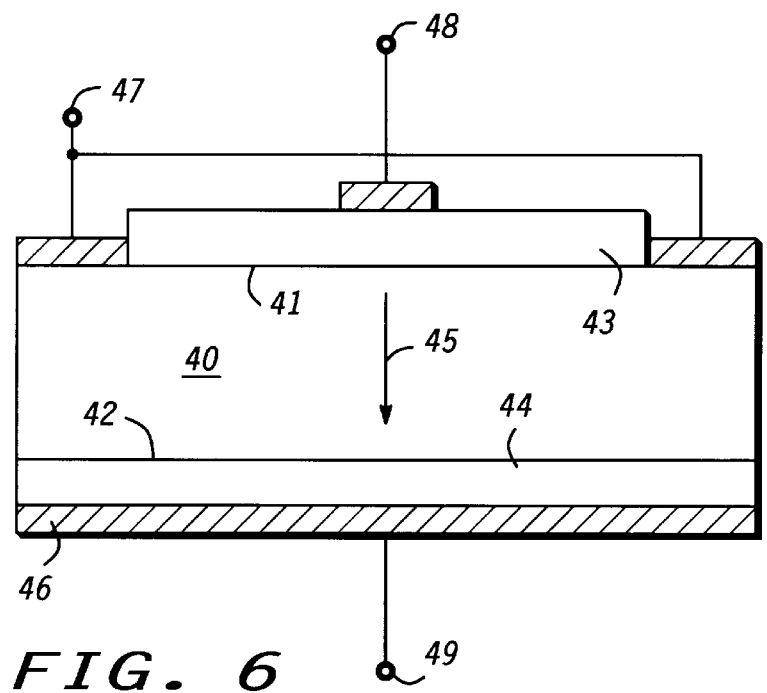
FIG. 6 is a cross-sectional view of an alternate embodiment of a light emitting diode and a detector diode integrated on a semiconductor substrate in accordance with the present invention.

FIG. 6 is an alternate embodiment of a light emitting diode 41 and a detector diode 42 integrated on a semiconductor substrate 40 in accordance with the present invention.

In the embodiment of FIG. 6 an epitaxial layer 43 is formed on a planar side of semiconductor substrate 40. Epitaxial layer 43 forms an anode of light emitting diode 41. A terminal 48 couples to epitaxial layer 43. Semiconductor substrate 40 forms a cathode of light emitting diode 41. On a planar side opposite from which epitaxial layer 43 is formed, an epitaxial layer 44 is formed on semiconductor substrate 40. Epitaxial layer 44 forms an anode of detector diode 42. Semiconductor substrate 43 forms a cathode of detector diode 42. A metal layer 46 provides an electrical connection point to epitaxial layer 44. A terminal 49 couples to metal layer 46. A terminal 47 couples to semiconductor substrate 40 providing an electrical connection point..

Light emitting diode 41 is normally operated in a forward biased mode and detector diode 42 is normally operated in a reverse biased or photovoltaic mode. Light is emitted from light emitting diode 41 when it is forward biased. A portion of the emitted light transmits through semiconductor substrate 40, as illustrated by arrow 45. Forming light emitting diode 41 and detector diode 42 on opposite sides of semiconductor substrate 40 aligns them to one another so that detector diode 42 receives light transmitted through semiconductor substrate 40 directly. The light received by detector diode 42 generates a current that is a function of the light received when biased in a photovoltaic or reverse biased mode. Direct reception of light by detector diode 42 provides a stable and constant light flux coupling necessary for linear optocouplers.

Figure 7:
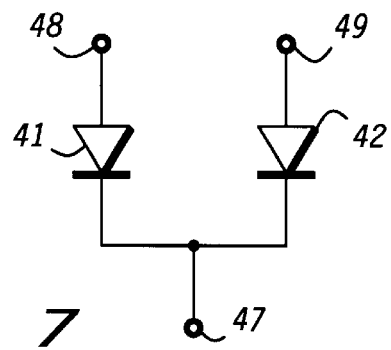
FIG. 7 is a schematic diagram of the light emitting diode and the detector diode of FIG. 6 in accordance with the present invention.

FIG. 7 is a schematic representation of light emitting diode 41 and detector diode 42 illustrated in FIG. 6. Terminal 47 couples to the common cathodes of light emitting diode 41 and detector diode 42. Terminal 48 couples to the anode of light emitting diode 41 and terminal 49 couples to the anode of detector diode 42.

Figure 8:
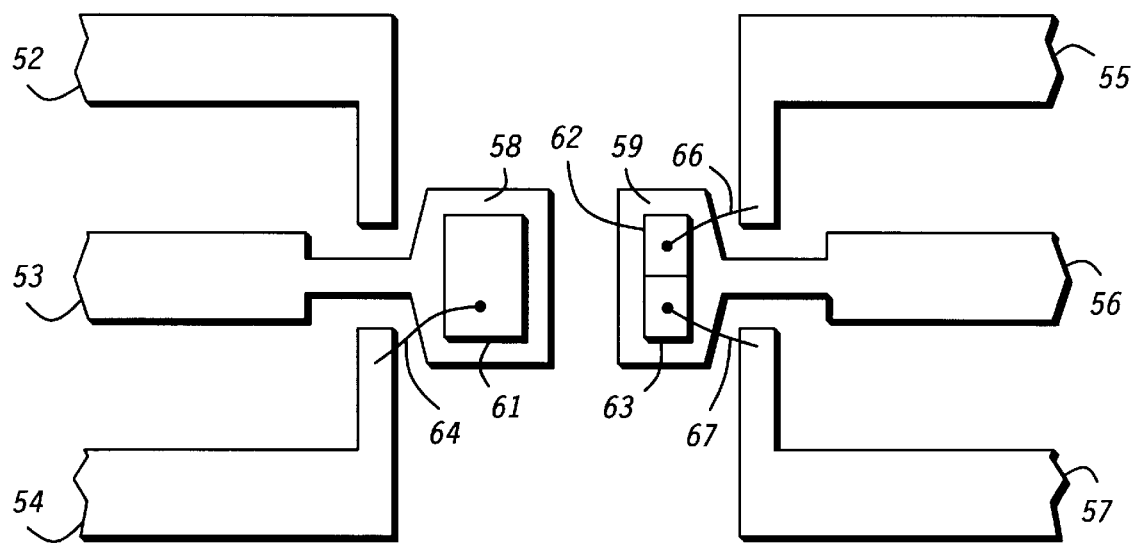
FIG. 8 is a top view of a lead frame having a photo detector diode and an integrated light emitting diode and a detector diode mounted thereon in accordance with the present invention.

FIG. 8 is an illustration of a photo detector diode 61 and an integrated light emitting diode 62 and detector diode 63 mounted on a lead frame 51 to form a linear optocoupler.

Lead frame packages are well known in the art for their simple manufacture, low cost, and reliability. Lead frame 51 includes leads 52–57, a mounting area 58, and a mounting area 59. Mounting areas 58 and 59 are co-planar. Leads 52–57 provide electrical interconnect to photo detector diode 61, light emitting diode 62, and detector diode 63.

Photo detector diode 61 is similar to photo detector diode 17 shown in FIG. 1. It is a discrete component that is used to isolate one circuit from another (see FIG. 1), photo detector diode 61 is optically coupled to light emitting diode 62. Photo detector diode 61 has an anode and a cathode respectively coupled to leads 54 and 53. In the preferred embodiment, attaching or mounting photo detector diode 61 to mounting area 58 also electrically couples the cathode to lead 53. A bond wire 64 couples the anode of photo detector diode 61 to lead 54. Lead 52 is unused.

Light emitting diode 62 and detector diode 63 are formed similar to that shown in FIG. 3. A side not shown is metallized with a light reflective material that is electrically conductive. When attached to mounting area 59 the light reflective material couples the semiconductor substrate corresponding to the common cathodes of light emitting diode 62 and detector diode 63 to lead 56. An anode of light emitting diode 62 is coupled to lead 55 by a bond wire 66. An anode of detector diode 63 is coupled to lead 57 by a bond wire 67. This arrangement provides a simple and cost effective means for building a linear optocoupler.

Figure 9:
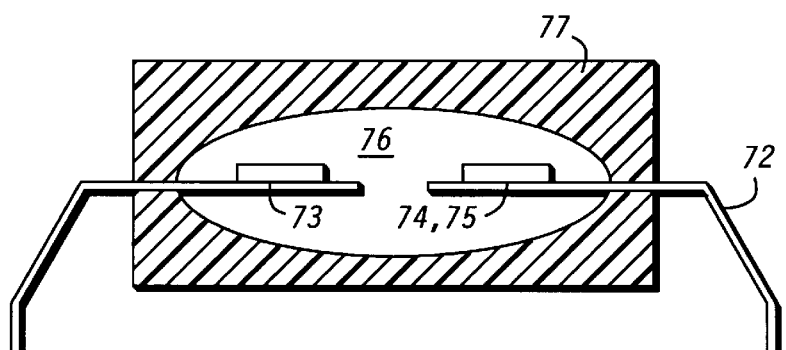
FIG. 9 is a cross-sectional view of a package illustrating an optical coupling between a photo detector diode and a light emitting diode in accordance with the present invention.

FIG. 9 is a cross-sectional view of a package 71 housing a linear optocoupler. FIG. 9 illustrates an optical coupling between a photo detector diode 73 and a light emitting diode 74. Light emitting diode 74 is integrated on a semiconductor substrate with a detector diode 75.

A lead frame 72 has photo detector diode 73, light emitting diode 74, and detector diode 75 mounted similarly to that described in FIG. 8. Photo detector diode 73 and light emitting diode 74 are physically separated from one another and mounted co-planar on lead frame 72. Optical coupling between photo detector diode 73 and light emitting diode 74 is enhanced by a light flux coupling media 76 which channels and reflects light emitted by light emitting diode 74 to photo detector diode 73. In the preferred embodiment, light flux coupling media 76 is silicone gel. A protective enclosure 77 is formed around a portion of lead frame 72, light flux coupling media 76, photo detector diode 73, light emitting diode 74, and detector diode 75. Protective enclosure 77 is typically formed from plastic or epoxy and protects the linear optocoupler from an external environment.

A linear optocoupler having many advantages has been described above. A key factor in the increased efficiency of the linear optocoupler is the integration of a light emitting diode and a detector diode on a semiconductor substrate. Integration is achieved by forming a light emitting diode that emits light at a frequency transmissive to the semiconductor substrate on which the light emitting diode is formed. Light from the light emitting diode transmits through the semiconductor substrate to be directly received by the detector diode or reflected back through the semiconductor substrate to be received by the detector diode.

Integration of the light emitting diode and the detector diode provides many benefits to forming the linear optocoupler. Placing the detector diode in close proximity to the light emitting diode provides constant and repeatable flux coupling between the light emitting diode and the detector diode. This increases linearity that is difficult to achieve in a linear optocoupler application or increases accuracy when monitoring light output. Device sizes can also be reduced due to the close proximity of the components. Integration also reduces component count in a linear optocoupler reducing cost and manufacturing complexity. For example, a linear optocoupler using discrete components (light emitting diode, detector diode, and photo detector diode are each a discrete component) has a complex and expensive package to manufacture due to the alignment of the light emitting diode to both the photo detector diode and the detector diode. Integration of the light emitting diode and the detector diode eliminates the need for external alignment between the two. Only the photo detector diode need be aligned for receiving light emitted by the light emitting diode. This alignment is made non-critical by the use of a light flux coupling media such as silicone gel described above. By now it should be appreciated that a linear optocoupler has been provided having a light emitting diode and a detector diode integrated on a common substrate that reduces size, increases accuracy, lowers cost, and decreases manufacturing complexity.

We claim:

1. A linear integrated optocoupler comprising:

an integrated light emitting diode and detector diode wherein said detector diode detects light emitted by said light emitting diode and provides a signal for linearizing a response of said light emitting diode, said integrated light emitting diode and detector diode comprising:

a semiconductor substrate;

a first epitaxial layer formed on a first side of said semiconductor substrate;

a second epitaxial layer formed on a second side of said semiconductor substrate, said first and second sides of said semiconductor substrate oppose one another, said first epitaxial layer is an anode of said light emitting diode, said second epitaxial layer is an anode of said detector diode, and said semiconductor substrate is a common cathode of said integrated light emitting diode and detector diode;

a photodetector diode for receiving light emitted by said light emitting diode;

a lead frame including a first area and a second area, said first and second areas being coplanar, said integrated light emitting diode and detector diode being conductively mounted to said first area of said lead frame and said photodetector diode being conductively mounted to said second area, said photodetector diode is electrically and physically isolated from said integrated light emitting diode and detector diode, a light flux coupling material placed on and between said first and second areas of said lead frame for coupling light emitted by said light emitting diode to said photodetector diode wherein said light flux coupling material covers said integrated light emitting diode and detector diode on said first area and said photodetector diode on said second area; and a protective enclosure formed around said first and second areas and said light flux coupling material for enclosing said light emitting diode and detector diode, and said photodetector diode.

2. The linear optocoupler as recited in claim 1 wherein said light flux coupling material is a silicone gel.

3. The linear optocoupler as recited in claim 1 wherein said protective enclosure is plastic.

* * * * *